United States Patent
Kobayashi

(10) Patent No.: US 6,887,771 B2
(45) Date of Patent: May 3, 2005

(54) SEMICONDUCTOR DEVICE AND METHOD FOR FABRICATING THE SAME

(75) Inventor: Yutao Kobayashi, Tatsuno-machi (JP)

(73) Assignee: Seiko Epson Corporation, Tokyo (JP)

(*) Notice: Subject to any disclaimer, the term of this patent is extended or adjusted under 35 U.S.C. 154(b) by 71 days.

(21) Appl. No.: 10/368,447

(22) Filed: Feb. 20, 2003

(65) Prior Publication Data

US 2003/0162369 A1 Aug. 28, 2003

(30) Foreign Application Priority Data

Feb. 26, 2002 (JP) ........................................ 2002-049188

(51) Int. Cl.$^7$ .............................................. H01L 21/78
(52) U.S. Cl. ...................................................... 438/460
(58) Field of Search ................................ 438/465, 464, 438/463, 462, 461, 460, 118, 33, 114, 36; 156/250

(56) References Cited

U.S. PATENT DOCUMENTS 5,897,337 A * 4/1999 Kata et al. ................... 438/114
5,982,042 A 11/1999 Nakamura
6,656,758 B1 * 12/2003 Shinogi et al. ............... 438/33

FOREIGN PATENT DOCUMENTS

| JP | 54-45570 | 4/1979 |
| JP | 11-121507 | 4/1999 |
| JP | 2001-7052 | 1/2001 |

* cited by examiner

Primary Examiner—David Zarneke
Assistant Examiner—Monica D. Harrison
(74) Attorney, Agent, or Firm—Oliff & Berridge, PLC

(57) ABSTRACT

The invention provides a semiconductor device and a method of fabricating the same in which the side faces and chip edge of an IC chip obtained by dicing a semiconductor wafer are coated with an overcoat film. A method of fabricating a semiconductor device in accordance with the present invention includes: 1) preparing a semiconductor wafer on which semiconductor elements are formed, 2) dicing the semiconductor wafer along scribed lines at a depth of 20 μm or more to form grooves 4-along the scribed lines, 3) forming an overcoat film on the necessary parts of the semiconductor wafer including the surfaces of the grooves, 4) optionally forming a thick electrode, and 5) dividing the semiconductor wafer into individual IC chips and chip size packages by dicing the semiconductor wafer along the grooves.

19 Claims, 8 Drawing Sheets

SEMICONDUCTOR DEVICE AND METHOD FOR FABRICATING THE SAME

BACKGROUND OF THE INVENTION

1. Field of Invention

The present invention relates to semiconductor devices and methods of fabricating the same. More particularly, the invention relates to a semiconductor device in which an overcoat film is formed o n the edge and side faces of each IC chip obtained by dicing a semiconductor wafer, and a method of fabricating the same.

2. Description of Related Art

FIGS. 7(a) to 7(c) are sectional views showing steps in a related art method of fabricating a semiconductor device.

In the fabrication process of the semiconductor device, as show in FIG. 7(a), a chip electrode 103 is formed on an IC pad section (not shown in FIG. 7(a)) in a semiconductor wafer 101 on which elements are formed.

Next, as shown in FIG. 7(b), in order to protect the active surfaces of the IC chips, an overcoat film 105 composed of a photosolder resist or the like is formed over the entire upper face of the semiconductor wafer 101 including the chip electrode (or bump) 103. Such as a polyimide or silicone resin may also be used for the overcoat film 105.

A photoresist film (not shown in FIG. 7(b)) is then formed on the overcoat film 105, and a resist pattern having an opening above the chip electrode 103 is formed on the overcoat film by exposing and developing the photoresist film. The overcoat film 105 on the chip electrode 103 can then be etched using the resist pattern as a mask. Alternatively, photoetching can be performed using a light-shielding mask. Thereby, as shown in FIG. 7(c), the chip electrode 103 is exposed. If necessary, a thick electrode can then be formed.

Next, dicing is performed in order to divide the semiconductor wafer 101 into individual IC chips. In the dicing step, the semiconductor wafer is cut with a dicing saw (not shown in FIG. 7(c)).

Scribed lines (not shown in FIG. 7(c)) are formed on the upper face of the semiconductor wafer 101. Preferably, the width of the scribed line is larger than the width of the dicing saw by approximately 20% to 30%. For example, when the dicing saw has a width of approximately 100 μm, the width of the scribed line is set at approximately 120 μm.

Next, first dicing (half cutting) is performed along the scribed lines. In the first dicing step, about a half of the thickness of the semiconductor wafer is cut. Dicing traces are thereby formed on the upper face of the semiconductor wafer 101.

Next, second dicing (full cutting) is performed along the dicing traces from the upper face side of the semiconductor wafer. In the second dicing step, the remaining thickness of the semiconductor wafer that is not cut in the first dicing step is cut. (For example, approximately 20% of the thickness of the semiconductor wafer is cut.) The semiconductor wafer 101 is thereby divided into individual IC chips. The second dicing is performed at a processing rate of approximately 70 mm/sec in order to prevent the IC chips from being damaged or to reduce such damage. In such a case, the revolving speed of the dicing saw is approximately 40,000 rpm.

Instead of the second dicing (full cutting), cracking may be performed to divide the semiconductor wafer 101 into individual IC chips.

FIGS. 8(a) to 8(c) are sectional views showing steps in another related art method of fabricating a semiconductor device. The same reference numerals are used for the same components as those in FIGS. 7(a) to 7(c), and only the different parts are described.

First, as shown in FIG. 8(a), a semiconductor wafer 101 is prepared on which elements are formed, and an overcoat film 105 is formed on the entire upper face of the semiconductor wafer 101.

Next, as shown in FIG. 8(b), an opening is formed in the overcoat film 105 at the position above an IC pad section (not shown in FIG. 8(b)). A chip electrode 103 is then formed in the opening.

As shown in FIG. 8(c), dicing is performed in order to divide the semiconductor wafer 101 into individual IC chips.

SUMMARY OF THE INVENTION

In each of the related art methods of fabricating semiconductor devices described above, the semiconductor wafer 101 is diced after the overcoat film 105 is formed on the upper face of the semiconductor wafer 101. Therefore, the overcoat film 105 is not formed on the cut surfaces of the semiconductor wafer (i.e., the side faces of the IC chips). Consequently, since silicon is exposed at the side faces of the IC chips, things, such as water, for example, may enter the IC chips from the side faces. Under the circumstances, there is a demand for a more effective method of fabricating a chip size package (CSP) in which a protective film, such as an overcoat film, is also formed on the side faces of an IC chip obtained by dicing a semiconductor wafer.

The present invention addresses or overcomes the above and/or other problems, and provides a semiconductor device in which an overcoat film is formed on the side faces of each IC chip obtained by dicing a semiconductor wafer. The invention also provides a method of fabricating the same.

In order to address or overcome the above, in one aspect of the present invention, a method of fabricating a semiconductor device includes: a semiconductor wafer preparation step of preparing a semiconductor wafer on which semiconductor elements are formed, a half cutting step of dicing the semiconductor wafer along scribed lines at a depth of 20 μm or more to form grooves along the scribed lines, an overcoat film formation step of forming an overcoat film on the entire upper face of the semiconductor wafer including the surfaces of the grooves, and a full cutting step of dicing the semiconductor wafer along the grooves to divide the semiconductor wafer into individual IC chips.

In accordance with the method of fabricating the semiconductor device described above, after the semiconductor wafer is half-cut, the overcoat film is formed on the entire upper face of the semiconductor wafer and the surfaces of the grooves are also coated with the overcoat film. The semiconductor wafer is then full-cut. Consequently, since the side faces of the IC chips can be coated with the overcoat film so that at least 20 μm of the thickness thereof is covered with the overcoat film, it is possible to prevent things, such as water, for example, from entering the IC chips from the side faces, or to reduce such entry. It is also possible to prevent or reduce problems, such as detachment, cracks of the overcoat film in the vicinity of the edges of the IC chips.

In the method of fabricating the semiconductor device of the present invention, preferably, the width of the groove formed in the half cutting step is wider than the cut width of the semiconductor wafer in the full cutting step. The reason for this is that the overcoat film is formed on the cut surface obtained in the half cutting step. That is, by setting the half cut width to be wider than the full-cut width, the overcoat film is ensured to surround the side faces of the IC chips and the overcoat film can be formed on the side faces of the IC chips. In the method of fabricating the semiconductor device of the present invention, preferably, the groove formed in the half cutting step may have a cross-section which is at least partially tapered or rounded.

In the method of fabricating the semiconductor device of the present invention, an electrode may be formed on the upper surface of a pad section of the semiconductor wafer prepared in the semiconductor wafer preparation step.

In the method of fabricating the semiconductor device of the present invention, an end of a lead extending to the inner area the chip may be formed on a pad section of the semiconductor wafer prepared in the semiconductor wafer preparation step, and an electrode having a larger surface area than that of the pad section may be formed on the other end of the lead. The inner area of the chip refers to an area that lies inside the IC pad section when viewed in plan.

The method of fabricating the semiconductor device of the present invention may further include: exposing the electrode by removing the overcoat film on the electrode between the overcoat film formation step and the full cutting step. The method of fabricating the semiconductor device of the present invention, optionally, may further include: forming a projecting electrode after exposing the electrode.

The method of fabricating the semiconductor device of the present invention may further include: forming an opening in the overcoat film at a position above a pad section of the semiconductor wafer and forming an electrode in the opening between the overcoat film formation step and the full cutting step.

In the method of fabricating the semiconductor device of the present invention, an end of a lead extending to the inner area of the chip may be formed on a pad section of the semiconductor wafer prepared in the semiconductor wafer preparation step, and the method may further include: forming an opening in the overcoat film at a position above the other end of the lead and forming an electrode having a larger surface area than that of the pad section in the opening between the overcoat film formation step and the full cutting step.

In another aspect of the present invention, a semiconductor device includes: an IC chip and an overcoat film extending to the side faces of the IC chip so as to cover at least 20 μm of the thickness of the IC chip and extending over the upper face of the IC chip. The semiconductor device is fabricated by preparing a semiconductor wafer on which semiconductor elements are formed, dicing the semiconductor wafer along scribed lines at a depth of 20 μm or more to form grooves along the scribed lines, forming the overcoat film on the entire upper face of the semiconductor wafer including the surfaces of the grooves, and dicing the semiconductor wafer along the grooves.

In the semiconductor device of the present invention, at least a portion of the edge of the IC chip may be tapered or rounded.

In the semiconductor device of the present invention, the semiconductor wafer may include a pad section, and an electrode may be formed on the upper surface of the pad section.

In the semiconductor device of the present invention, the semiconductor wafer may include a pad section, an end of a lead extending to the inner area of the chip may be formed on the pad section, and an electrode having a larger surface area than that of the pad section may be formed on the other end of the lead.

In the semiconductor device of the present invention, preferably, an opening is formed in the overcoat film above the electrode to expose the electrode. In the semiconductor device of the present invention, a projecting electrode may be optionally formed on the exposed electrode.

DETAILED DESCRIPTION OF PREFERRED EMBODIMENTS

Exemplary embodiments of the present invention are described below with reference to the drawings.

FIGS. 1(a) to 1(c) and FIGS. 2(d) and 2(e) are sectional views showing steps in a method of fabricating a semiconductor device in a first exemplary embodiment of the present invention. In this exemplary embodiment, a silicon wafer is used as a semiconductor wafer.

Figure 1:
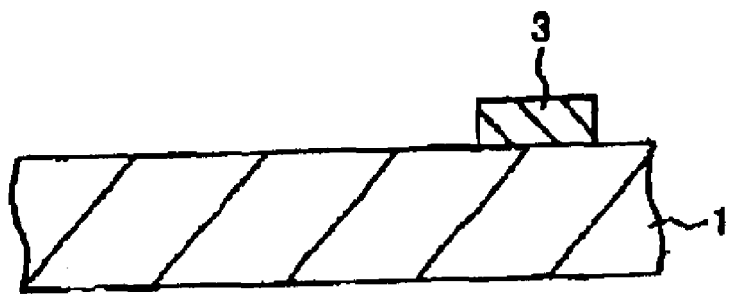
FIGS. 1(a) to 1(c) are sectional views showing steps in a method of fabricating a semiconductor device in a first exemplary embodiment of the present invention.
Figure 1:
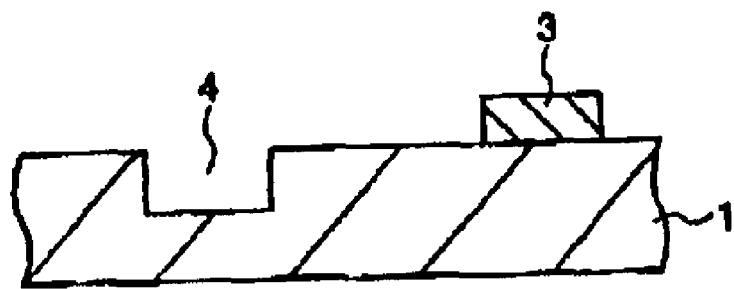
Figure 1:
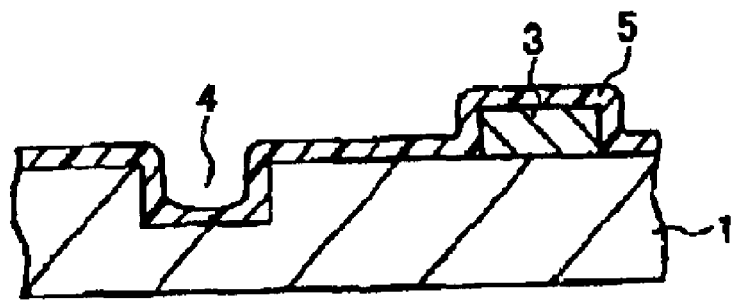

First, as shown in FIG. 1(a), a silicon wafer 1 is prepared. Scribed lines, which delimit chip regions, are formed on the upper face of the silicon wafer 1. Preferably, the width of the scribed line is larger than the width of the dicing saw by approximately 20% to 30%. For example, when the dicing saw has a width of approximately 100 μm, the width of the scribed line is set at approximately 120 μm. Elements which are formed on the silicon wafer 1 are not shown in the drawings.

A chip electrode (or bump) 3 is formed on an IC pad section (not shown in FIG. 1(a)) of the silicon wafer 1 on which elements are formed.

Next, as shown in FIG. 1(b), first dicing (half cutting) is performed along the scribed lines from the upper face side of the silicon wafer 1. The half cut width is preferably larger than the optimum width for full cutting(described below). In the first dicing step, the silicon wafer 1 is cut by 20 μm or more, e.g., about a half of the thickness is cut. A dicing trace (groove) 4 is thereby formed on the silicon wafer 1. In FIG. 1(b), the groove 4 has a rectangular cross-section. However, the cross-sectional shape is not limited thereto, and the groove may have a cross-section which is at least partially tapered or rounded. In order to form a tapered or rounded portion in the cross-section of the groove, a dicing saw with a blade having a cross-section provided with a tapered or rounded portion is used. By using such a blade, at least a portion of the edge of the resultant chip is tapered or rounded.

Next, as shown in FIG. 1(c), in order to protect the active surface of the IC chip, an overcoat film 5 composed of a photosolder resist or the like is formed over the entire upper face of the silicon wafer 1 including the chip electrode 3. The surface of the dicing trace 4 is also coated with the overcoat film 5. In such a manner, the semiconductor device in the wafer state is sealed by the overcoat film. A polyimide, a silicone resin, or the like is also preferably used for the overcoat film 5.

Figure 2:
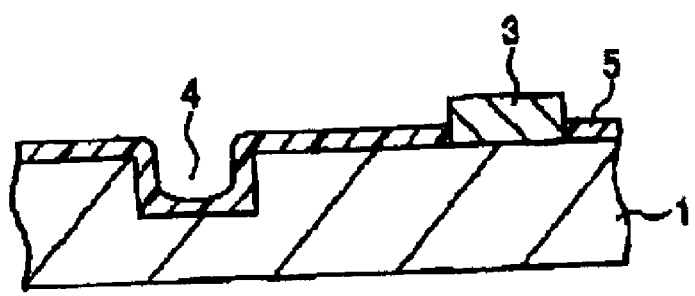
FIGS. 2(d) and 2(e) are sectional views showing steps subsequent to the step shown in FIG. 1(c) in the method of fabricating the semiconductor device in the first exemplary embodiment of the present invention.
Figure 2:
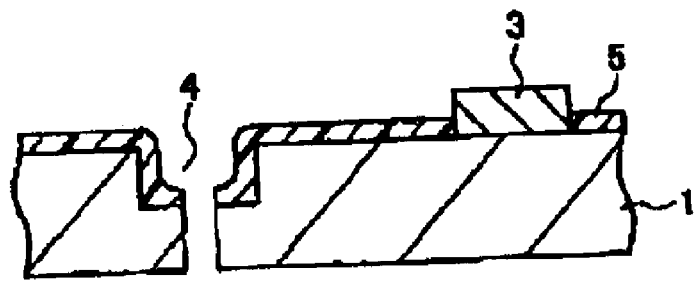

As shown in FIG. 2(d), a photoresist film (not shown in FIG. 2(d)) is formed on the overcoat film 5, and a resist pattern having an opening above the chip electrode 3 is formed on the overcoat film by exposing and developing the photoresist film. The overcoat film 5 on the chip electrode 3 is then etched using the resist pattern as a mask. Alternatively, photoetching is performed using a light-shielding mask.

The chip electrode 3 is thereby exposed. If necessary, a thick electrode is then formed.

Next, as shown in FIG. 2(e), second dicing (full cutting) is performed along the dicing trace 4 from the upper face side of the silicon wafer. In the second dicing step, the remaining thickness of the silicon wafer that is not cut in the first dicing step is cut. For example, approximately 20% of the thickness of the silicon wafer is cut. The silicon wafer 1 is thereby divided into individual IC chips. In this way a semiconductor package is formed, in which 20 μm or more of the side faces of the IC chip and the upper face of the IC chip are sealed with the overcoat film. A dicing saw having a smaller width than that of the dicing saw used in the first dicing step is used in the second dicing step. The reason for this is that the overcoat film 5 is formed on the cut surface in the first dicing step. As described above, when the width of the dicing saw used in the first dicing step is approximately 100 μm, preferably, a dicing saw with a width of approximately 60 μm is used in the second dicing step. In order to prevent the IC chips from being damaged or to reduce such damage, the second dicing is preferably performed at a slower processing rate than that in the first dicing step, for example, at approximately 70 mm/sec. In such a case, the revolving speed of the dicing saw is approximately 40,000 rpm.

Instead of the second dicing (full cutting), cracking may be performed to divide the silicon wafer 1 into IC chips.

In the first exemplary embodiment described above, after the silicon wafer 1 is half-cut, the overcoat film 5 is formed on the entire upper face of the overcoat film 5 and the surfaces of the dicing traces (grooves) are also coated with the overcoat film 5. The silicon wafer is then full-cut. In such a case, by setting the half-cut width larger than the full-cut width, the overcoat film is ensured to surround the side faces of the IC chips and the overcoat film 5 can be firmed on the side faces of the IC chips. Consequently, it is possible to prevent things, such as water, from entering the IC chips from the side faces, or to reduce the entry of such things. That is, it is possible to fabricate a more effective CSP in which a protective film, such as an overcoat film, is formed on the side faces of an IC chip obtained by dicing a silicon wafer.

Figure 3:
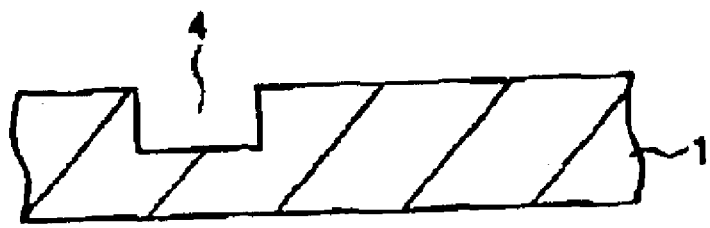
FIGS. 3(a) to 3(c) are sectional views showing an exemplary variation of the first exemplary embodiment.
Figure 3:
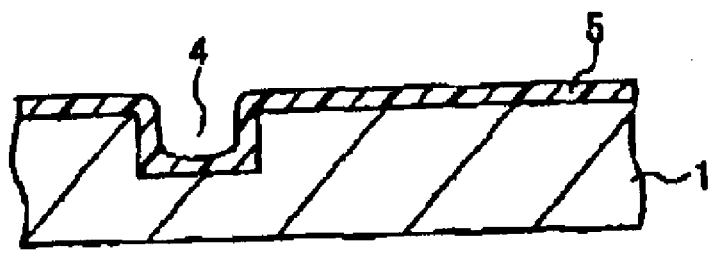
Figure 3:
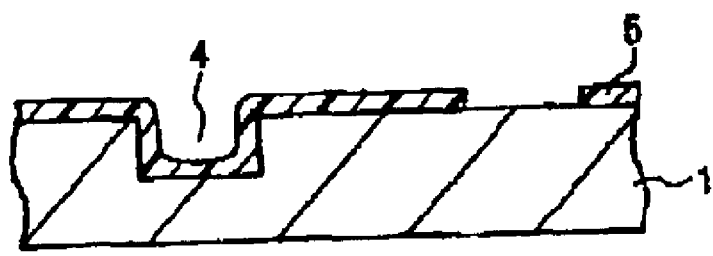

FIGS. 3(a) to 3(c) are sectional views showing a variation of the first exemplary embodiment. The same reference numerals are used for the same components as those in FIGS. 1(a) to 1(c) and FIGS. 2(d) and 2(e), and only the different parts are described below.

First, as shown in FIG. 3(a), a silicon wafer 1 is prepared on which elements are formed. No chip electrode is formed on the silicon wafer 1. Next, first dicing (half cutting) is performed along the scribed lines from the upper face side, and dicing traces (grooves) 4 are fanned in the silicon wafer 1.

As shown in FIG. 3(b), an overcoat film 5 is formed on the entire upper face of the silicon wafer 1 including the dicing traces 4.

As shown in FIG. 3(c), a photoresist film (not shown in FIG. 3(c)) is formed on the overcoat film 5, and a resist pattern having an opening above an IC pad section (not shown in FIG. 3(c)) is formed by exposing and developing the photoresist film. By etching the overcoat film 5 using the resist pattern as a mask, the IC pad section is exposed.

After the above, as shown in FIG. 2(d), a chip electrode 3 is formed on the IC pad section. In order to form the chip electrode, various methods may be used. For example, the chip electrode may be formed by plating, the chip electrode may be formed by a dipping method, or the chip electrode may be formed by attaching a ball. Next, as shown in FIG. 2(e), second dicing (full cutting) is performed along the dicing trace 4 from the upper face side of the silicon wafer.

In an exemplary variation of the method described above, the same effect as that in the first exemplary embodiment can be attained.

FIGS. 4(a) to 4(c) and FIGS. 5(d) and 5(e) are sectional views showing steps in a method of fabricating a semiconductor device in a second exemplary embodiment of the present invention. In this exemplary embodiment, a silicon wafer is used as a semiconductor wafer.

Figure 4:
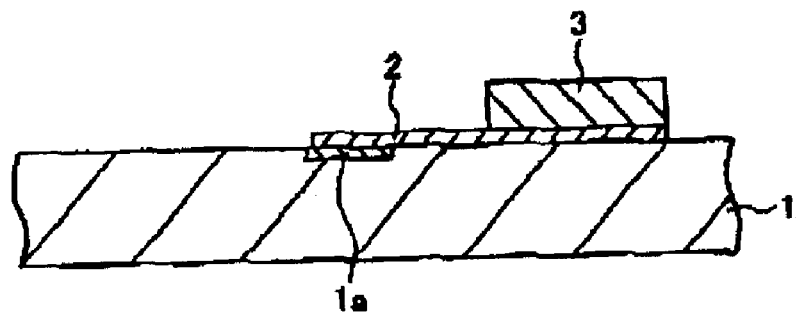
FIGS. 4(a) to 4(c) are sectional views showing steps in a method of fabricating a semiconductor device in a second exemplary embodiment of the present invention.
Figure 4:
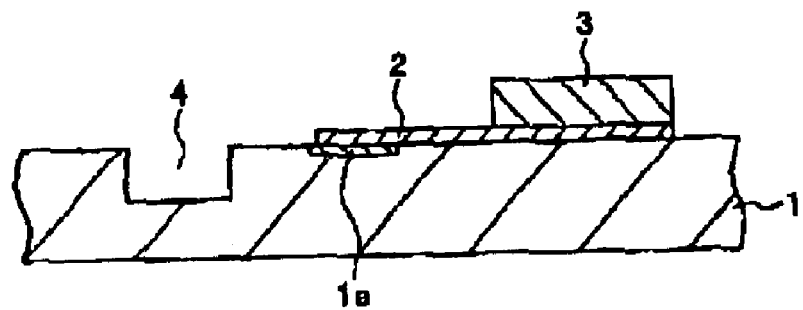
Figure 4:
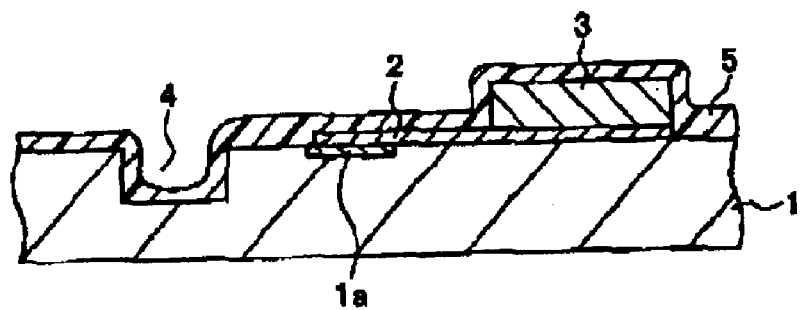

First, as shown in FIG. 4(a), a silicon wafer 1 is prepared. Scribed lines, which delimit chip regions, are formed on the upper face of the silicon wafer 1. Preferably, the width of the scribed line is larger than the width of the dicing saw by approximately 20% to 30%. Elements which are formed on the silicon wafer 1 are not shown in FIG. 4(a).

An end of a lead 2 is formed on an IC pad section 1a in the silicon wafer 1 on which elements are formed. The lead 2 extends to the inner area of the IC chip. A chip electrode (or a bump) 3 having a larger area than that of the IC pad section is formed on the other end of the lead 2. By using such a lead 2, a chip electrode 3 having a large area can be formed on the IC chip.

Next, as shown in FIG. 4(b), first dicing (half cutting) is performed along the scribed line from the upper face side of the silicon wafer 1. The half-cut width is preferably larger than the optimum width for full cutting, which is described below. In the first dicing step, the silicon wafer 1 is cut by 20 μm or more, e.g., about a half of the thickness is cut. A dicing trace (groove) 4 is thereby formed on the silicon wafer 1. In the FIG. 4(b), the groove 4 has a rectangular cross-section. However the cross-sectional shape is not limited thereto, and the groove may have a cross-section which is at least partially tapered or rounded, for example. In order to form a tapered or rounded portion in the cross-section of the groove, a dicing saw with a blade having a cross-section provided with a tapered or rounded portion is used. By using such a blade, at least a portion of the edge of the resultant chip is tapered or rounded.

Next, as shown in FIG. 4(c), in order to protect the, active surface of the IC chip, an overcoat film 5 composed of a photosolder resist or the like is formed over the entire upper face of the silicon wafer 1 including the chip electrode 3. The surface of the dicing trace 4 is also coated with the overcoat film 5. In such a manner, the semiconductor device in the wafer state is sealed by the overcoat film. A polyimide, a silicone resin, or the like is also preferably used for the overcoat film 5.

Figure 5:
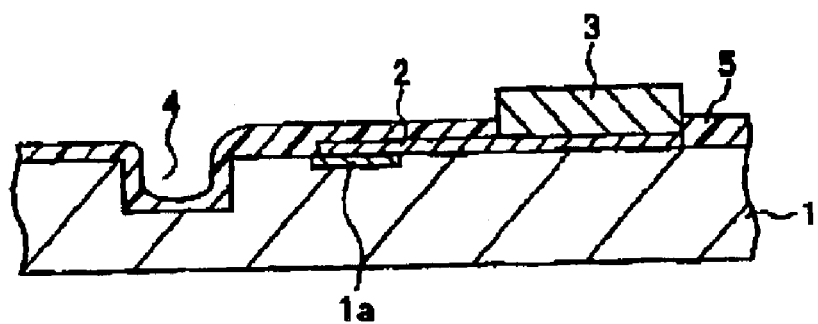
FIGS. 5(d) and 5(c) are sectional views showing steps subsequent to the step shown in FIG. 4(c) in the method of fabricating the semiconductor device in the second exemplary embodiment of the present invention.
Figure 5:
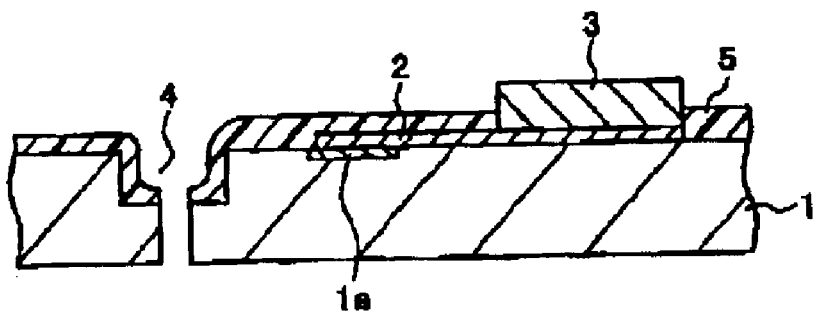

After the above, as shown in FIG. 5(d), a photoresist film (not shown in FIG. 5(d)) is formed on the overcoat film 5, and a resist pattern having an opening above the chip electrode 3 is formed on the overcoat film by exposing and developing the photoresist film. The overcoat film 5 on the chip electrode 3 is then etched using the resist pattern as a mask. Alternatively, photoetching is performed using a light-shielding mask.

The chip electrode 3 is thereby exposed. If necessary, a thick electrode is then formed.

Next, as shown in FIG. 5(e), second dicing (full cutting) is performed along the dicing trace 4 from the upper face side of the silicon wafer. In the second dicing step, the remaining thickness of the silicon wafer that is not cut in the first dicing step is cut. (For example, approximately 20% of the thickness of the silicon wafer is cut.) The silicon wafer 1 is thereby divided into individual IC chips. In this way, a semiconductor package is formed, in which 20 μm or more of the side faces of the IC chip and the upper face of the IC chip are sealed with the overcoat film. A dicing saw having a smaller width than that of the dicing saw used in the first dicing step is used in the second dicing step. The reason for this is that the overcoat film 5 is formed on the cut surface and the chip edge in the first dicing step.

Instead of the second dicing (full cutting), cracking may be performed to divide the silicon wafer into IC chips.

In the second exemplary embodiment, the same effect as that in the first exemplary embodiment can be also attained in a semiconductor device having chip electrodes (including electrode pads, bumps) with a large surface area. That is, after the silicon wafer 1 is half-cut, the overcoat film 5 is formed on the entire upper face of the silicon wafer and the surfaces of the dicing traces (grooves) are also coated with the overcoat film, and the silicon wafer is then full-cut.

In such a case, by setting the half-cut width larger than the full-cut width, the overcoat film is ensured to surround the side faces of the IC chips and the overcoat film 5 can be formed on the side faces of the IC chips. Consequently, it is possible to prevent things, such as water, for example, from entering the IC chips from the side faces, or reduce entry of such things. It is also possible to reduce or prevent problems, such as detachment, cracks, etc., of the overcoat film in the vicinity of the edges of the IC chips. That is, it is possible to fabricate a more effective CSP in which a protective film, such as an overcoat film, is formed on the side faces of an IC chip obtained by dicing a silicon wafer.

Figure 6:
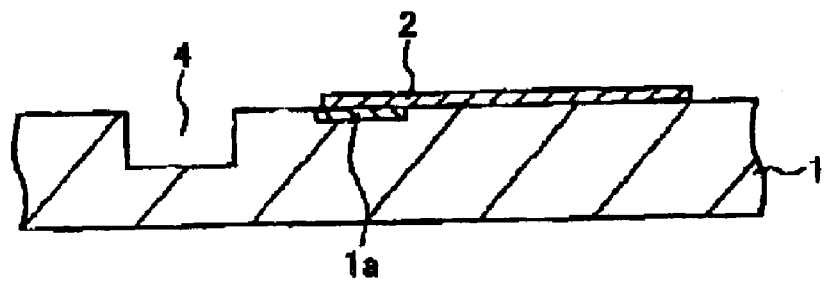
FIGS. 6(a) to 6(c) are sectional views showing an exemplary variation of the second exemplary embodiment.
Figure 6:
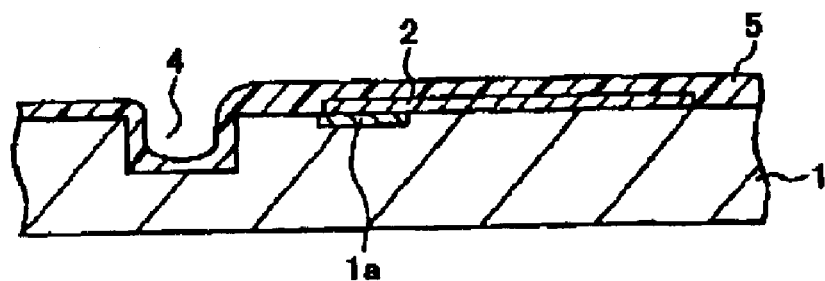
Figure 6:
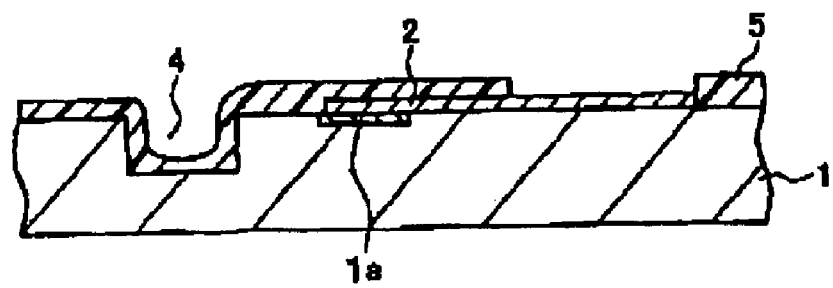
Figure 7:
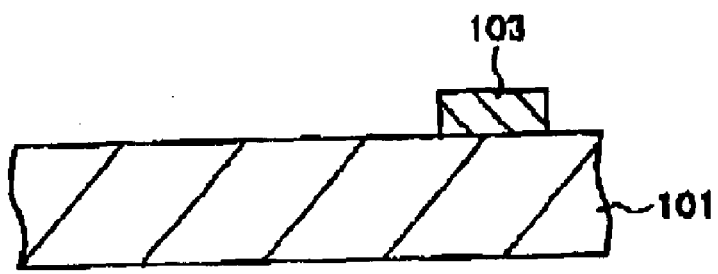
FIGS. 7(a) to 7(c) are sectional views showing steps in a related art method of fabricating a semiconductor device.
Figure 7:
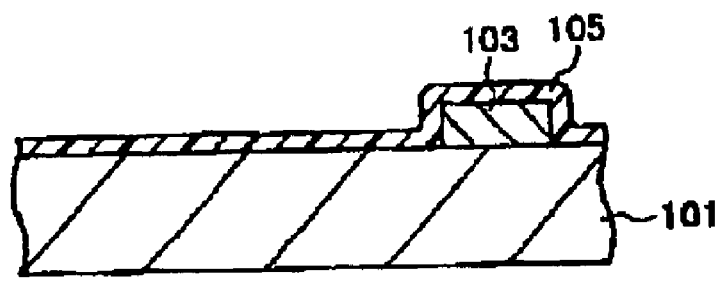
Figure 7:
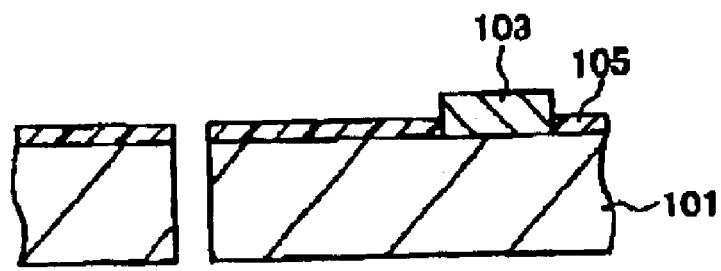
Figure 8:
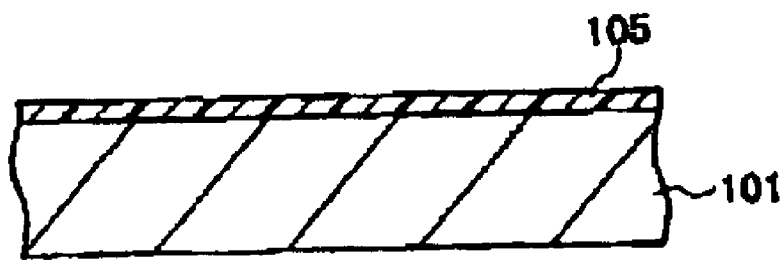
FIGS. 8(a) to 8(c) are sectional view showing steps in another related art method of fabricating a semiconductor device.
Figure 8:
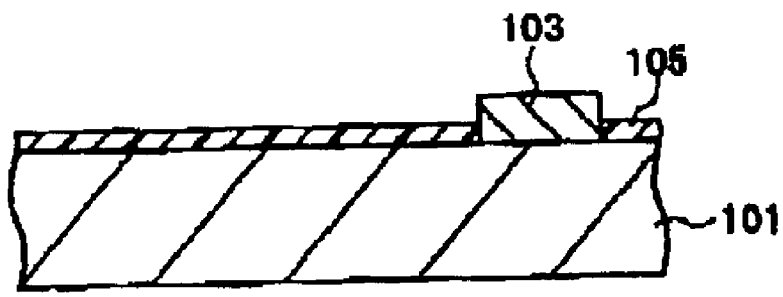
Figure 8:
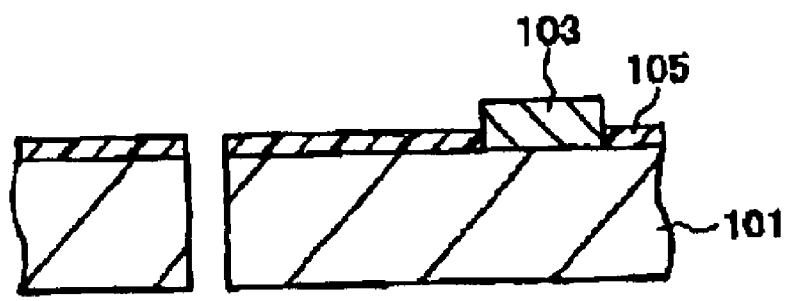

FIGS. 6(a) to 6(c) are sectional views showing an exemplary variation of the second exemplary embodiment. The same reference numerals are used for the same components as those in FIGS. 4(a) to 4(c) and FIGS. 5(d) and 5(e), and only the different parts are described below.

First, as shown in FIG. 6(a), a silicon wafer 1 is prepared on which elements are formed. No chip electrode is formed on the silicon wafer 1. Next, first dicing (half cutting) is performed along the scribed lines from the upper face side of the silicon wafer 1, and dicing traces (grooves) 4 are formed in the silicon wafer 1.

As shown in FIG. 6(b), an overcoat film 5 is formed on the entire upper face of the silicon wafer 1 including the dicing traces 4.

Next, as shown in FIG. 6(c), a photoresist film (not shown in FIG. 6(c)) is formed on the overcoat film 5, and a resist pattern having an opening above the other end of the lead 2 is formed on the overcoat film by exposing and developing the photoresist film. The overcoat film 5 is then etched using the resist pattern as a mask, and the other end of the lead 2 is thereby exposed.

As shown in FIG. 5(d), a chip electrode 3 is formed on the other end of the lead 2. In order to form the chip electrode, various methods may be used.

The same effect as that in the second exemplary embodiment can be attained in an exemplary variation of the method described above.

The present invention is not limited to the exemplary embodiments described above, and the invention is intended to cover various modifications. For example, the widths of the dicing saws used in the first and second dicing steps, the thickness of the overcoat film, the types of materials for the overcoat film and others may be changed appropriately. The present invention is also applicable to any semiconductor wafer other than a silicon wafer. In the present invention, the half-diced region and its vicinities may be coated separately.

As described above, in accordance with the present invention, after a semiconductor wafer is half-cut, an overcoat film is formed on the entire upper face of the semiconductor wafer including the surfaces of grooves, and the semiconductor wafer is then full-cut. Consequently, it is possible to provide a reliable semiconductor device in which the side faces and chip edge of an IC chip obtained by dicing a semiconductor wafer are coated with the overcoat film, and a method of fabricating the same.

What is claimed is:

1. A method of fabricating a semiconductor device, comprising:
   a semiconductor wafer preparation step of preparing a semiconductor wafer on which semiconductor elements are formed;
   a half cutting step of dicing the semiconductor wafer along scribed lines at a depth of 20 μm or more to form grooves extending at least half the thickness of the semiconductor wafer along the scribed lines;
   an overcoat film formation step of forming an overcoat film on the entire upper face of the semiconductor wafer including the surfaces of the grooves; and
   a full cutting step of dicing the semiconductor wafer along the grooves to divide the semiconductor wafer into individual IC chips.

2. The method of fabricating a semiconductor device according to claim 1, a width of the groove formed in the half cutting step being wider than a cut width of the semiconductor wafer in the full cutting step.

3. The method of fabricating a semiconductor device according to claim 1, the groove formed in the half cutting step having a cross-section which is at least partially tapered or rounded.

4. The method of fabricating a semiconductor device according to claim 1, further including forming a first electrode on the upper surface of a pad section of the semiconductor wafer prepared in the semiconductor wafer preparation step.

5. The method of fabricating a semiconductor device according to claim 1, an end of a lead extending to the inner area of the chip being formed on a pad section of the semiconductor wafer prepared in the semiconductor wafer preparation step, and a second electrode having a larger surface area than a surface area of the pad section being formed on the other end of the lead.

6. The method of fabricating a semiconductor device according to claim 4, further comprising: exposing the first electrode by removing the overcoat film on the first electrode between the overcoat film formation step and the full cutting step.

7. The method of fabricating a semiconductor device according to claim 6, further comprising: forming a projecting electrode optionally after the step of exposing the first electrode.

8. The method of fabricating a semiconductor device according to claim 1, further comprising: forming an opening in the overcoat film at a position above a pad section of the semiconductor wafer, and forming a second electrode in the opening between the overcoat film formation step and the full cutting step.

9. The method of fabricating a semiconductor device according to claim 1, an end of a lead extending to the inner area of the chip being formed on a pad section of the semiconductor wafer prepared in the semiconductor wafer preparation step, and the method further comprising: forming an opening in the overcoat film at a position above the other end of the lead and forming a second electrode having a larger surface area than a surface area of the pad section in the opening between the overcoat film formation step and the full cutting step.

10. A semiconductor device, comprising:
an IC chip having side faces, an upper face and a thickness; and
an overcoat film extending to the side faces of the IC chip so as to cover at least 20 µm of the thickness of the IC chip and extending over the upper face of the IC chip;
the semiconductor device being fabricated by preparing a semiconductor wafer on which semiconductor elements are formed, dicing the semiconductor wafer along scribed lines at a depth of 20 µm or more to form grooves extending at least half the thickness of the semiconductor wafer along the scribed lines, forming the overcoat film on the entire upper face of the semiconductor wafer including the surfaces of the grooves, and dicing the semiconductor wafer along the grooves.

11. The semiconductor device according to claim 10, at least a portion of the edge of the IC chip being tapered or rounded.

12. The semiconductor device according to claim 10, the semiconductor wafer including a pad section, and a first electrode formed on the upper surface of the pad section.

13. The semiconductor device according to claim 10, the semiconductor wafer including a pad section, an end of a lead extending to the inner area of the chip formed on the pad section, and a second electrode having a larger surface area than a surface area of the pad section formed on the other end of the lead.

14. The semiconductor device according to claim 12, an opening being formed in the overcoat film above the first electrode to expose the electrode.

15. The semiconductor device according to claim 14, further including a projecting electrode optionally formed on the exposed first electrode.

16. The method of fabricating a semiconductor device according to claim 5, further comprising: exposing the second electrode by removing the overcoat film on the second electrode between the overcoat film formation step and the full cutting step.

17. The method of fabricating a semiconductor device according to claim 16, further comprising: forming a projecting electrode optionally after the step of exposing the second electrode.

18. The semiconductor device according to claim 13, an opening being formed in the overcoat film above the second electrode to expose the second electrode.

19. The semiconductor device according to claim 18, further including a projecting electrode optionally formed on the exposed second electrode.

* * * * *